(12) United States Patent
Shih (10) Patent No.: US 11,605,612 B2
(45) Date of Patent: Mar. 14, 2023

(54) METHOD OF MANUFACTURING SEMICONDUCTOR PACKAGE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/520,526

(22) Filed: Nov. 5, 2021

(65) Prior Publication Data

US 2022/0059497 A1    Feb. 24, 2022

Related U.S. Application Data

(62) Division of application No. 16/795,006, filed on Feb. 19, 2020.

(51) Int. Cl.
*H01L 25/065* (2023.01)
*H01L 23/538* (2006.01)
(Continued)

(52) U.S. Cl.
CPC ...... *H01L 25/0652* (2013.01); *H01L 21/4857* (2013.01); *H01L 21/561* (2013.01);
(Continued)

(58) Field of Classification Search
CPC ..... H01L 25/0652; H01L 25/18; H01L 25/50; H01L 21/4857; H01L 21/561; H01L 23/3107; H01L 23/3135; H01L 23/49811; H01L 23/538; H01L 23/3128; H01L 23/5389; H01L 23/49816; H01L 24/16; H01L 24/19; H01L 24/73; H01L 24/92; H01L 2224/04105; H01L 2224/12105; H01L 2224/16227; H01L 2224/24137;
(Continued)

(56) References Cited

U.S. PATENT DOCUMENTS

2014/0185267 A1    7/2014   Kim et al.
2017/0062383 A1    3/2017   Shimizu et al.
(Continued)

OTHER PUBLICATIONS

Office Action dated Apr. 19, 2022 related to U.S. Appl. No. 16/795,006, wherein this application is a DIV of U.S. Appl. No. 16/795,006.
Office Action dated Jul. 6, 2022 related to U.S. Appl. No. 16/795,006, wherein this application is a DIV of U.S. Appl. No. 16/795,006.
(Continued)

*Primary Examiner* — Kyoung Lee
*Assistant Examiner* — Christina A Sylvia
(74) *Attorney, Agent, or Firm* — Xuan Zhang (57) ABSTRACT

The present disclosure provides a method of manufacturing a semiconductor package assembly. The method includes steps of providing a plurality of first dies arranged horizontally; forming a redistribution layer on the first dies and the first insulative material, wherein the redistribution layer is divided into a first segment and a second segment electrically isolated from the first segment; mounting a plurality of second dies on the first segment of the redistribution layer; depositing a second insulative layer on the second dies and the redistribution layer; and forming a plurality of conductive plugs penetrating through the second insulative material and contacting the second segment of the redistribution layer.

8 Claims, 14 Drawing Sheets

(51) Int. Cl.
*H01L 23/31* (2006.01)
*H01L 25/00* (2006.01)
*H01L 21/48* (2006.01)
*H01L 21/56* (2006.01)
*H01L 23/498* (2006.01)

(52) U.S. Cl.
CPC ...... *H01L 23/3107* (2013.01); *H01L 23/3135* (2013.01); *H01L 23/49811* (2013.01); *H01L 23/5383* (2013.01); *H01L 25/50* (2013.01); H01L 2225/06572 (2013.01)

(58) Field of Classification Search
CPC ........... H01L 2224/73259; H01L 2224/92224; H01L 2225/06572; H01L 2225/06524; H01L 2225/06541; H01L 2225/06589; H01L 2924/15192; H01L 2924/18162
See application file for complete search history.

(56) References Cited

U.S. PATENT DOCUMENTS

| | | |
|---|---|---|
| 2017/0256481 A1 | 9/2017 | Chen et al. |
| 2017/0263518 A1* | 9/2017 | Yu .............................. H01L 24/92 |
| 2017/0365587 A1 | 12/2017 | Hung et al. |
| 2017/0366906 A1 | 12/2017 | Lambert |
| 2018/0358269 A1 | 12/2018 | Bao et al. |
| 2019/0244905 A1* | 8/2019 | Yu ........................ H01L 25/0652 |
| 2020/0043891 A1 | 2/2020 | Yu et al. |
| 2022/0315793 A1* | 10/2022 | Kang ........................ C09D 7/62 |
| 2022/0356316 A1* | 11/2022 | Taki ......................... C08L 77/08 |

OTHER PUBLICATIONS

Office Action dated Oct. 18, 2022 related to U.S. Appl. No. 16/795,006, wherein this application is a DIV of U.S. Appl. No. 16/795,006.

* cited by examiner

METHOD OF MANUFACTURING SEMICONDUCTOR PACKAGE

CROSS-REFERENCE TO RELATED APPLICATION

This application is a divisional application of U.S. Non-Provisional application Ser. No. 16/795,006 filed Feb. 19, 2020, which is incorporated herein by reference in its entirety.

TECHNICAL FIELD

The present disclosure relates to a method of manufacturing a semiconductor device, and more particularly, to a method of manufacturing a semiconductor package including stacked semiconductor dies and through molding vias.

DISCUSSION OF THE BACKGROUND

As integrated circuit technologies continue to advance, ongoing efforts are made to increase performance and density. One approach explored by designers to realize such benefits is the implementation of stacked three-dimensional integrated circuits. Some areas where three-dimensional integrated circuits are suitable for consideration include stacking of two of more chips that are fabricated using the same or different fabrication processes to reduce the footprint of the integrated circuit system.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor package. The semiconductor package includes a first die, a second die, a plurality of conductive plugs and a redistribution layer. The redistribution layer includes a first segment and a second segment electrically isolated from the first segment. The first segment of the redistribution layer electrically connects the first die to the second die, and the second segment of the redistribution layer electrically connects the first die to the conductive plugs.

In some embodiments, the first die is stacked on the second die and the conductive plugs.

In some embodiments, the first segment of the redistribution layer is disposed between the first die and the second die, and the second segment of the redistribution layer is disposed between the first die and the conductive plugs.

In some embodiments, the first segment of the redistribution layer is surrounded by the second segment of the redistribution layer.

In some embodiments, wherein the second dies are arranged horizontally to parallel the conductive plugs.

In some embodiments, the semiconductor package further includes a dielectric layer encasing the redistribution layer, a first insulative material surrounding the first die, and a second insulative material surrounding the second die and the conductive plugs.

In some embodiments, the semiconductor package further includes a passivation layer, a conductive layer and a plurality of solder bumps; the passivation layer covers the second die and the conductive plugs, and the conductive layer penetrates through the passivation layer and includes a first portion connected to the second die and a second portion connected to the conductive plugs. The plurality of solder bumps are mounted on the conductive layer.

Another aspect of the present disclosure provides a method of manufacturing a semiconductor package assembly. The method includes steps of providing a plurality of first dies arranged horizontally; forming a redistribution layer on the first dies and the first insulative material, wherein the redistribution layer is divided into a first segment and a second segment electrically isolated from the first segment; mounting a plurality of second dies on the first segment of the redistribution layer; depositing a second insulative layer on the second dies and the redistribution layer; and forming a plurality of conductive plugs penetrating through the second insulative material and contacting the second segment of the redistribution layer.

In some embodiments, the method further includes a step of forming at least one dielectric layer to encase the redistribution layer.

In some embodiments, the method further includes steps of depositing a passivation layer on the second dies, the conductive plugs and the second insulating layers; forming a conductive layer penetrating through the passivation layer, wherein the conductive layer comprises a first portion electrically coupled to the second dies and a second portion electrically isolated from the first portion and contacting the conductive plugs; and forming a plurality of solder bumps connected to the conductive layer.

In some embodiments, the method further includes a step of performing a grinding process to expose conductive lines of the second dies before the deposition of the passivation layer.

In some embodiments, a melting point of the first insulative material is greater than that of the second insulative material.

In some embodiments, the first dies have a first distance therebetween, the second dies have a second distance therebetween, and the second distance is less than the first distance.

In some embodiments, the first segment is disposed at a central portion of the redistribution layer, and the second segment surrounds the first segment.

In some embodiments, the first dies and the second dies are symmetric with respect to a central axis of the semiconductor package.

In some embodiments, the method further includes a step of molding the first dies with a first insulative material before the formation of the redistribution layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1:
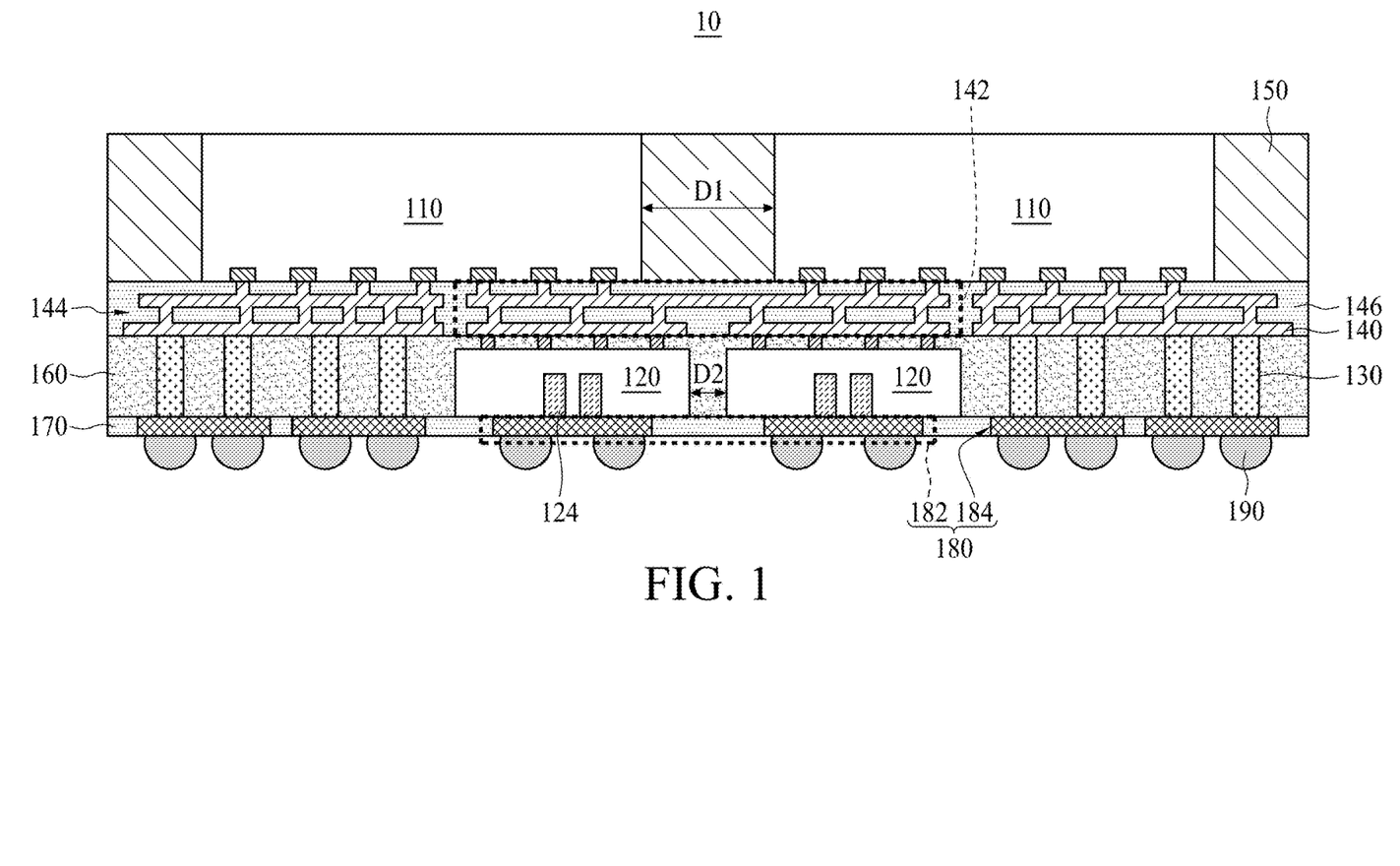
FIG. 1 is a cross-sectional view of a semiconductor package in accordance with some embodiments of the present disclosure.

FIG. 1 is a cross-sectional view of a semiconductor package 10 in accordance with some embodiments of the present disclosure. Referring to FIG. 1, the semiconductor package 10 can be a wafer-level semiconductor package and includes one or more first dies 110, one or more second dies 120, a plurality of conductive plugs 130 and a redistribution layer 140 including a first segment 142 and at least one second segment 144 electrically isolated from the first segment 142, wherein the first segment 142 electrically connects the first dies 110 to the second dies 120, and the second segment 144 electrically connects the first dies 110 to the conductive plugs 130.

The first dies 110 arranged horizontally can be stacked on the second dies 120 and the conductive plugs 130, the first segment 142 of the redistribution layer 140 is disposed between the first dies 110 and the second dies 120, and the second segment 144 of the redistribution layer 140 is disposed between the first dies 110 and the conductive plugs 130 to reduce a footprint of the semiconductor package 10.

In some embodiments, the first die 110 is a system-on-chip (SoC) that includes a central processing unit (CPU), a graphics processing unit (GPU), a dynamic random access memory (DRAM) controller, or any combination thereof. The second dies 120 arranged horizontally can be memory dies, such as dynamic random access memory (DRAM) dies. The first dies 110 have a first footprint, and the second dies 120 have a second footprint smaller than the first footprint; therefore, the conductive plugs 130 can arranged horizontally parallel to the second dies 120. In some embodiments, the conductive plugs 130 surrounding the second dies 120 are arranged in an equally-spaced configuration. In some embodiments, the first dies 110 have a first distance D1 therebetween, and the second dies 120 have a second distance D2 therebetween; the first distance D1 is greater than the second distance D2 to facilitate heat dissipation.

The semiconductor package 10 can further includes a first insulative layer 150 surrounding the first dies 110 and a second insulative layer 160 surrounding the second dies 120 and the conductive plugs 130. In some embodiments, the conductive plugs 130 penetrating through the second insulative layer 160 and contacting the second segment 144 of the redistribution layer 140 can have a height equal to or greater than that of the second dies 120.

In some embodiments, the semiconductor package 10 further includes a passivation layer 170, a conductive layer 180 and a plurality of solder bumps 190 electrically coupled to the conductive layer 180. The passivation layer 170 covers sides of the second dies 120 and the conductive plugs 130 opposite to where the redistribution layer 140 is disposed. The conductive layer 180 penetrates through the passivation layer 170 and includes a first portion 182 physically connected to conductive lines (such as through silicon vias) 124 of the second dies 120 and a second portion 184 physically connected to the conductive plugs 130.

Figure 2:
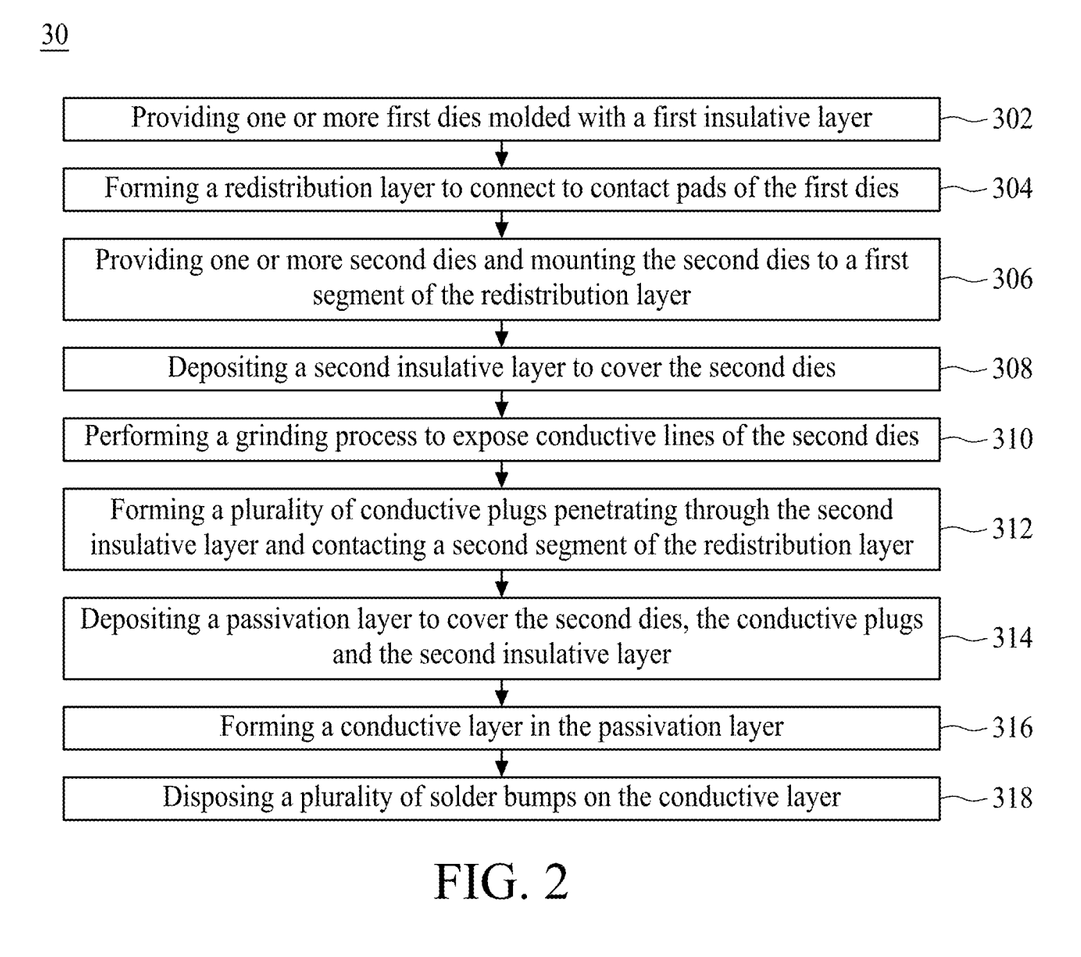
FIG. 2 is a flow diagram illustrating a method of manufacturing a semiconductor package in accordance with some embodiments of the present disclosure.

FIG. 2 is a flow diagram illustrating a method 30 of manufacturing a semiconductor package in accordance with some embodiments of the present disclosure, and FIGS. 3 through 14 illustrate cross-sectional views of intermediate stages in the formation of a semiconductor package in accordance with some embodiments of the present disclosure. The stages shown in FIGS. 3 to 14 are also illustrated schematically in the flow diagram in FIG. 2. In the following discussion, the fabrication stages shown in FIGS. 3 to 14 are discussed in reference to the process steps shown in FIG. 2.

Figure 3:
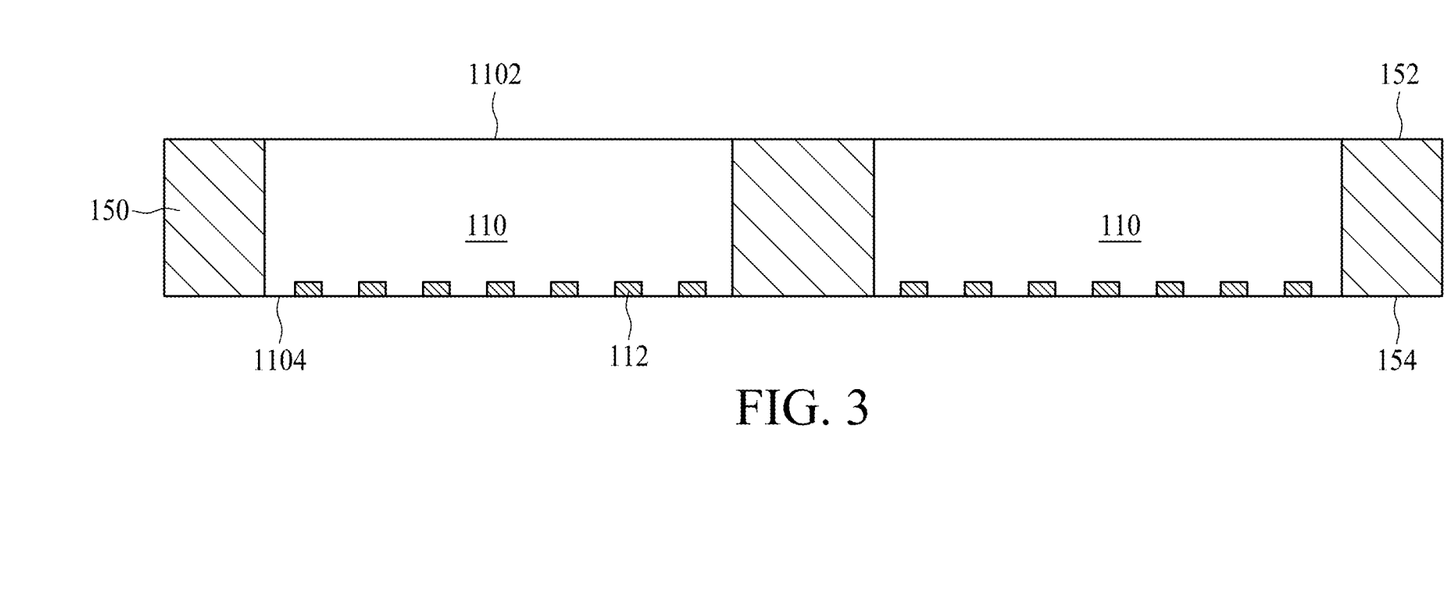
FIGS. 3 through 14 illustrate cross-sectional views of intermediate stages in the formation of a semiconductor package in accordance with some embodiments of the present disclosure.

Referring to FIG. 3, one or more first dies 110 molded with a first insulative layer 150 are provided according to a step 302 in FIG. 2. The first dies 110 encased by the first insulative layer 150 are arranged horizontally. The first die 110 has a front surface 1102 and a back surface 1104 opposite to the front surface 1102, which are exposed through the first insulative material 150. In some embodiments, the first die 110 can include a plurality of conductive pads 112 connected to the back surface 1104. In some embodiments, the first insulative material 150 has a top surface 152 coplanar with the front surfaces 1102 of the first dies 110 and a bottom surface 154 coplanar with the back surfaces 1104 of the first dies 110. The formation of the first dies 110 molded with the first insulating layer 150 includes (1) adhering the first dies 110 on a temporary carrier by an adhesive layer, (2) applying a first insulating material to surround the first dies 110, and (3) removing the adhesive layer and the temporary carrier. In some embodiments, the temporary carrier may include silicon, ceramics, metal, or the like, and the adhesive layer is a temporary and any strippable or easily removed material may be used, for example, films, tapes, liquid adhesives. In some embodiments, the first insulating layer 150 may be formed using thermoset molding compounds in a transfer mold press, for example.

Figure 4:
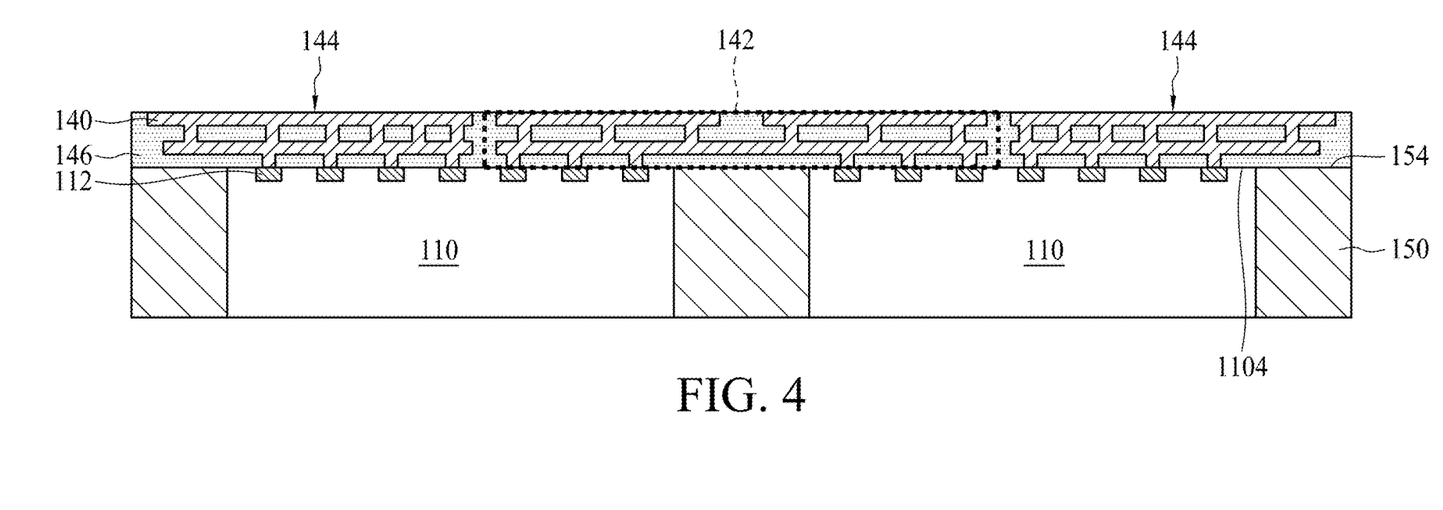

Referring to FIG. 4, a redistribution layer 140 is at least formed to connect to the contact pads 112 of the first dies 110 according to a step 304 in FIG. 2. The redistribution layer 140 can include a plurality of metal layers and a plurality of vias stacked one above the other. The redistribution layer 140 includes a first segment 142 and at least one second segment 144 electrically isolated from the first segment 142. The first segment 142 of the redistribution layer 140 can be surrounded by the second segment 144 of the redistribution layer 140. In other words, the second segment 144 of the redistribution layer 140 is disposed at a periphery of the first segment 142. The redistribution layer 140 may include aluminum, copper, tungsten, titanium, titanium nitride, or the like.

As shown in FIG. 4, in some embodiments, at least one dielectric layer 146 can be formed to encase the redistribution layer 140 to reduce corrosion of the redistribution layer 140. In some embodiments, the dielectric layer 146 can further cover the back surfaces 1104 of the first dies 110 and the bottom surface 154 of the first insulating layer 150. In some embodiments, a portion of the redistribution layer 140 away from the first dies 110 is exposed through the dielectric layer 146. In some embodiments, the deposition temperature of the dielectric layer 146 is less than the melting point of the first insulating layer 150 to prevent the first insulating layer 150 from breaking. The dielectric layer 146 may include organic material such as polyimide (PI) or inorganic materials such as silicon nitride or silicon oxide.

Figure 5:
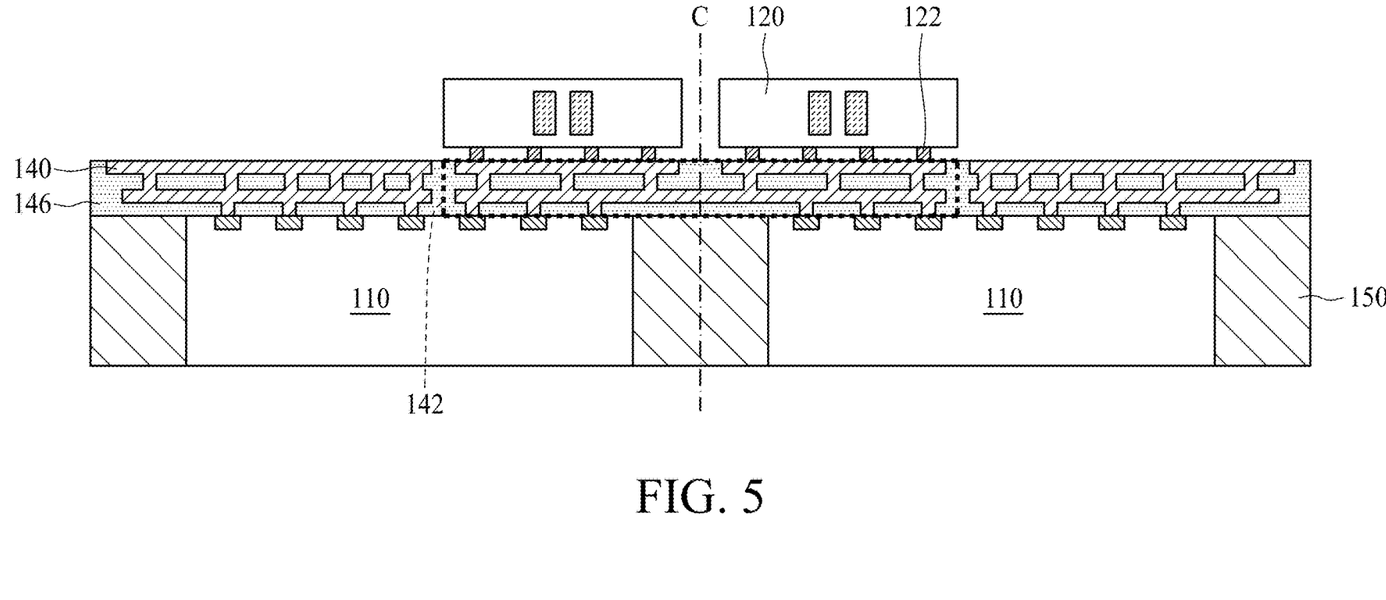

Referring to FIG. 5, in some embodiments, one or more second dies 120 are provided and mounted on the first segment 142 of the redistribution layer 140 according to a step 306 in FIG. 2. Accordingly, the first segment 142 of the redistribution layer 140 between the first dies 110 and the second dies 120 serves as an electrical interconnection to the first dies 110 and the second dies 120. In some embodiments, the second dies 120 can be electrically connected to the redistribution layer 140 through one or more contact pads 122 formed on the second dies 120. In some embodiments, the first dies 110 and the second dies 120 are symmetric with respect to a central axis C.

Figure 6:
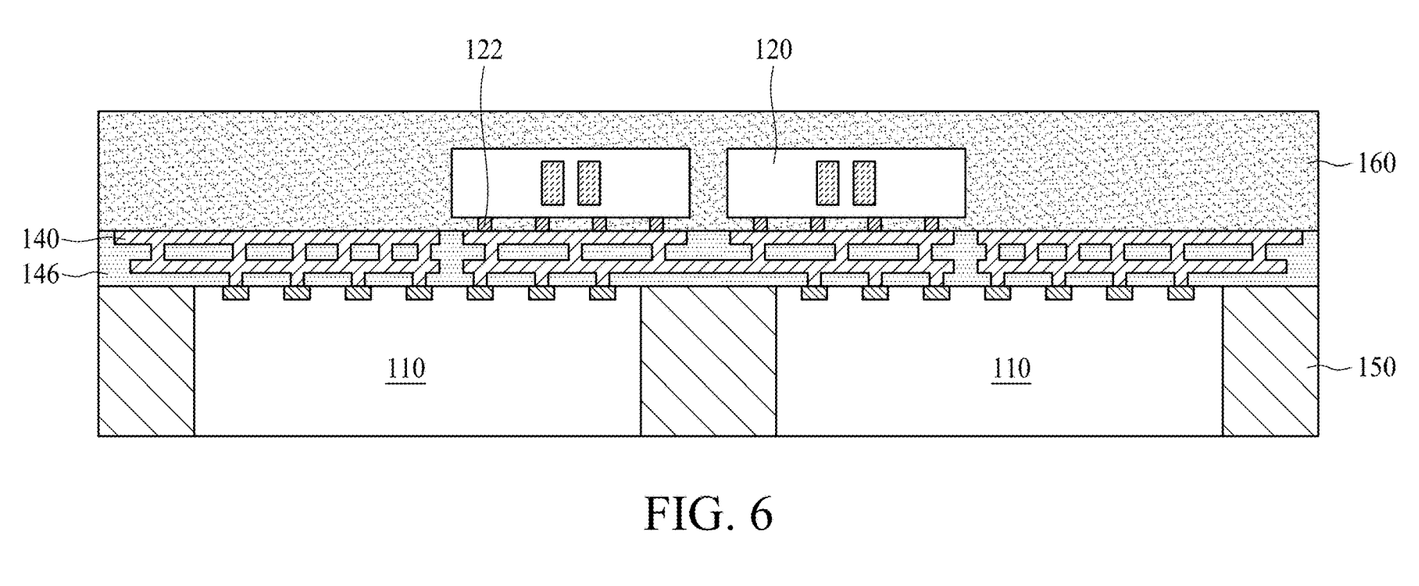

Referring to FIG. 6, after mounting the second dies 120 on the redistribution layer 140, a second insulative layer 160 is applied to encase the second dies 120 according to a step 308 in FIG. 2. The second insulative layer 160 may further cover the redistribution layer 140 and the dielectric layer 146. In some embodiments, the first insulative material 150 and the second insulative material 160 may have different compositions so that the second insulative layer 160 can be cured at relatively lower temperature.

Figure 7:
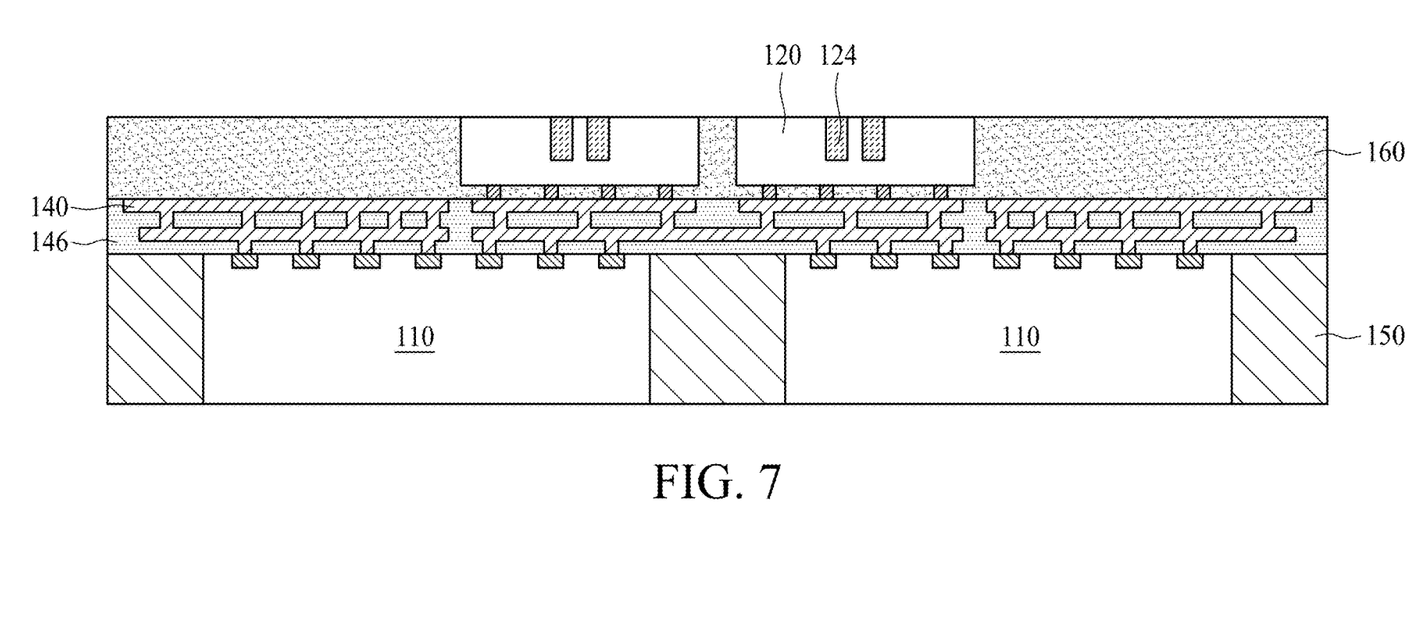

Referring to FIG. 7, a grinding process is performed to polish away portions of the second dies 120 and the second insulative layer 160 according to a step 310 in FIG. 2. Accordingly, conductive lines 124 of the second dies 120 are exposed. In some embodiments, the grinding process includes a chemical mechanical polishing (CMP) process and/or wet etching process.

Figure 8:
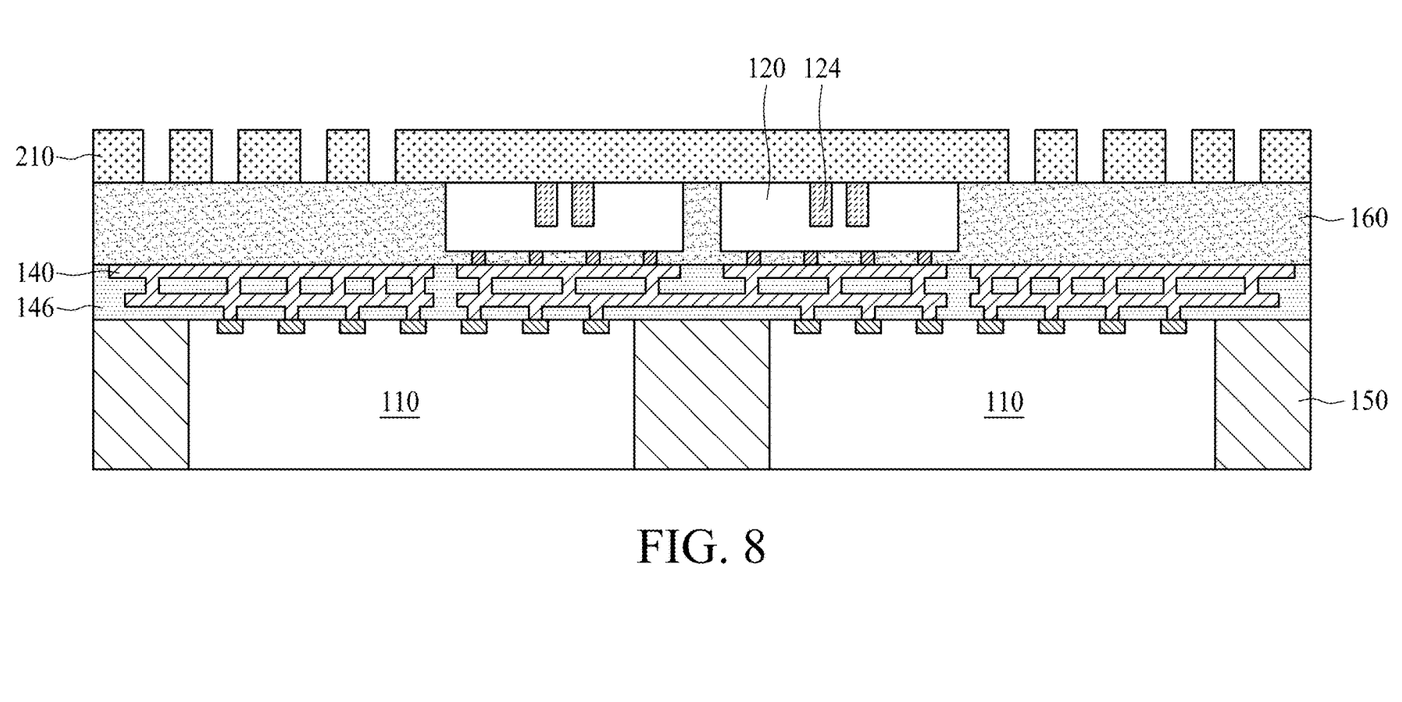
Figure 9:
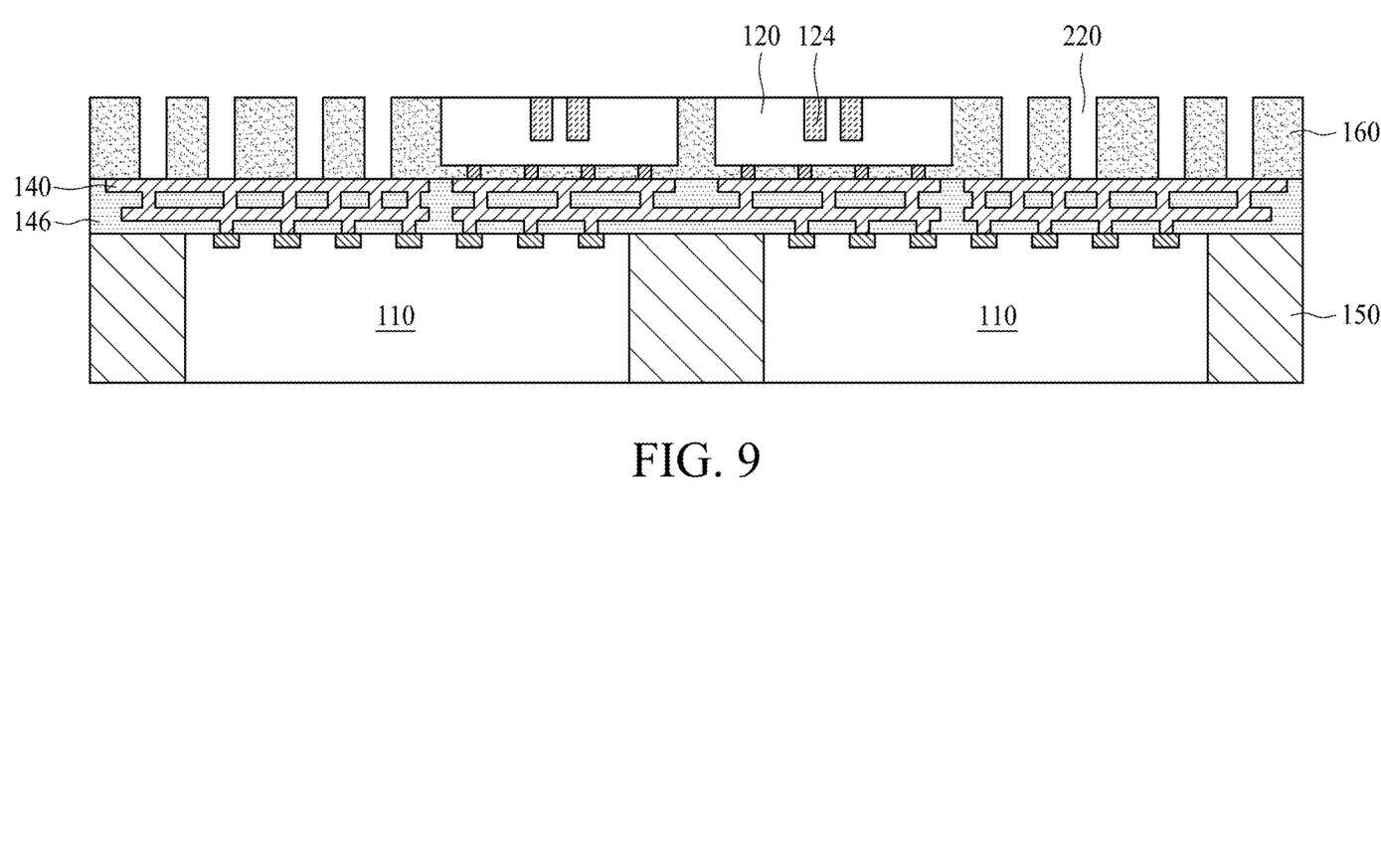
Figure 10:
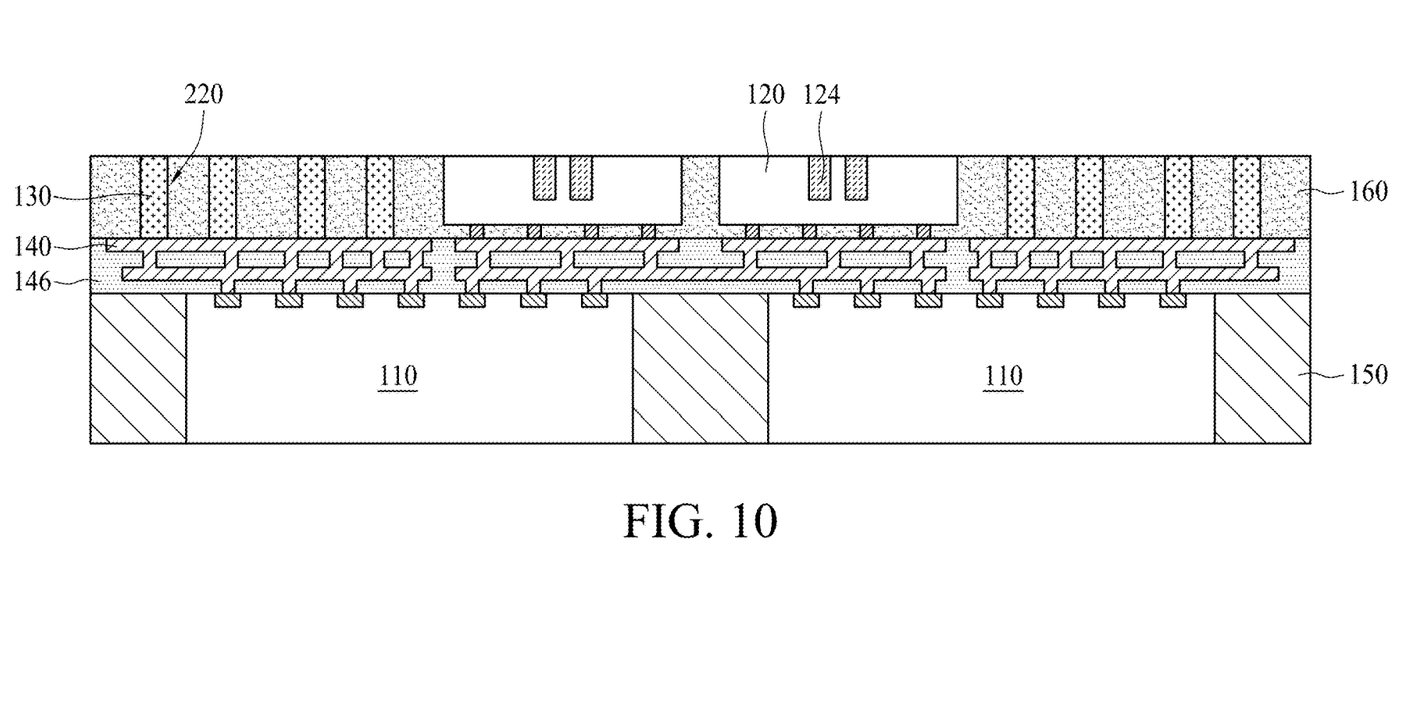

Referring to FIGS. 8 to 10, a plurality of conductive plugs 130 are formed to penetrate the second insulative layer 160 and contact the second segment 144 of the redistribution layer 140 according to a step 312 in FIG. 2. The conductive plugs 130 are formed by providing a mask layer 210 on the second insulative layer 160 (as shown in FIG. 8), performing an etching process to remove portions of the second insulative layer 160 that are not covered by the mask layer 210 to form a plurality of openings 220 (as shown in FIG. 9), and depositing a conductive material in the openings 220 (as shown in FIG. 10). As shown in FIG. 8, the second dies 120 are covered by the mask layer 210. In some embodiments, after the etching process is performed, the mask layer 210 is removed, for example, by an ashing process or a wet strip process. In some embodiments, the conductive material may include copper, aluminum, tungsten or the like and is deposited in the openings 220 and over the second insulative layer 160 by using an electroplating process or a CVD process. In some embodiments, a planarizing process can be performed to expose the second insulative layer 160 after the deposition of the conductive material. In some embodiments, the planarizing process includes a CMP process and/or a wet etching process.

Figure 11:
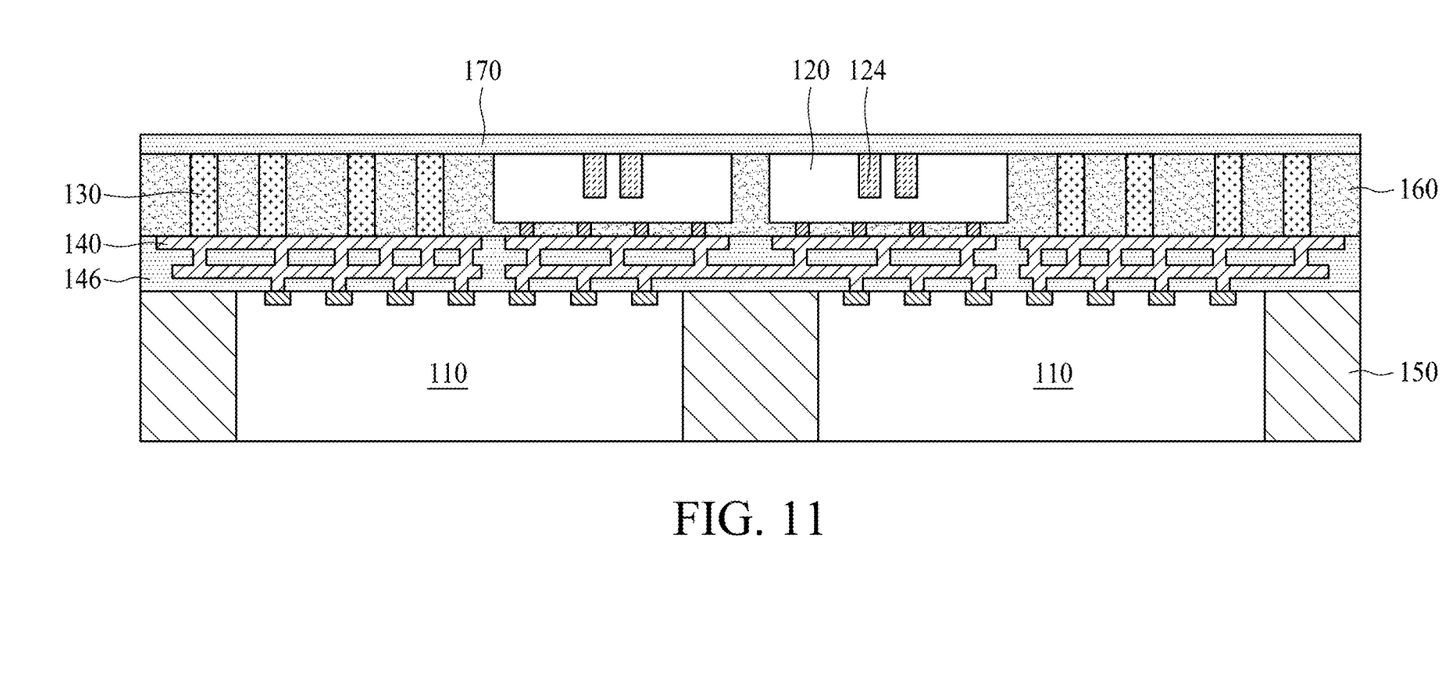

Referring to FIG. 11, a passivation layer 170 is deposited to cover the second dies 120, the conductive plugs 130 and the second insulative material 160 according to a step 314 in FIG. 2. In some embodiments, the passivation layer 170 is typically deposited with a low-pressure CVD process or a plasma-enhanced CVD process. After the passivation layer 170 is deposited, a planarization process using any suitable method, such as an etch-back process or a CMP process, is optionally performed on the passivation layer 170 for providing better topography.

Figure 12:
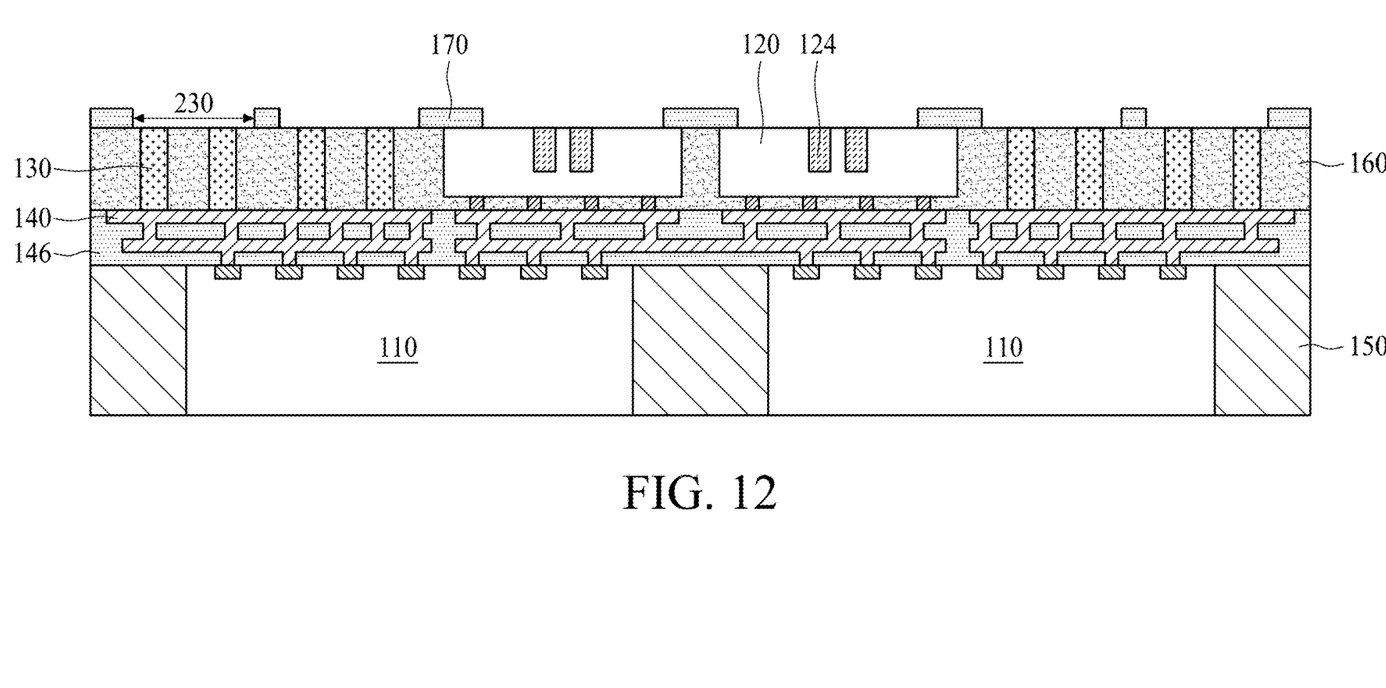

As shown in FIG. 12, after the deposition of the passivation layer 170, a plurality of openings 230 can be formed in the passivation layer 170 to expose respective conductive lines 124 of the second dies 120 and the conductive plugs 130. In some embodiments, the formation of the openings 230 includes (1) forming a photoresist pattern (not shown) on the passivation layer 170, wherein the photoresist pattern defines a pattern to be etched into the passivation layer 170, (2) performing a third etching process, using the photoresist pattern as a mask, to etch the passivation layer 170 and thereby form the openings 230 in the passivation layer 170, (3) removing the photoresist pattern.

Figure 13:
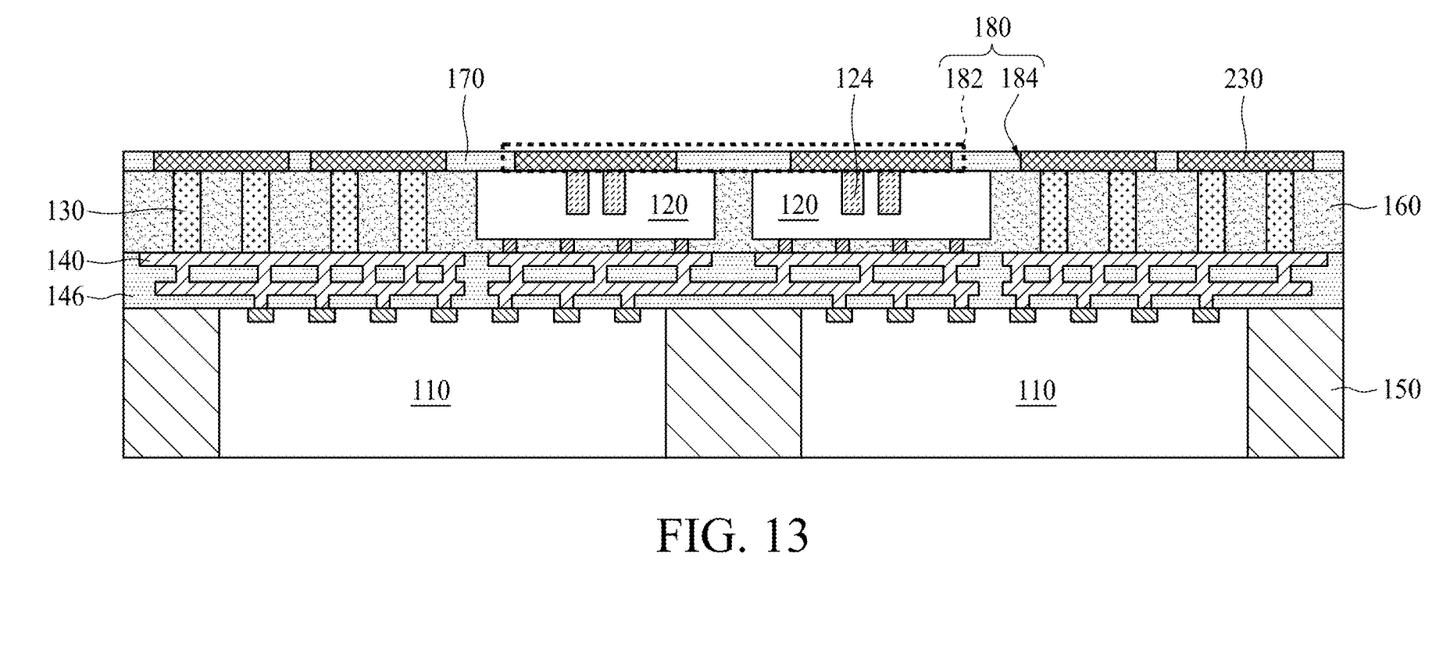

Referring to FIG. 13, one or more conductive materials are deposited over the passivation layer 170 and in the openings 230 to from a conductive layer 180 according to a step 316 in FIG. 2. The conductive layer 180 can be divided into a first portion 182 physically connected to the conductive lines 124 and a second portion 184 physically connected to the conductive plugs 130.

Figure 14:
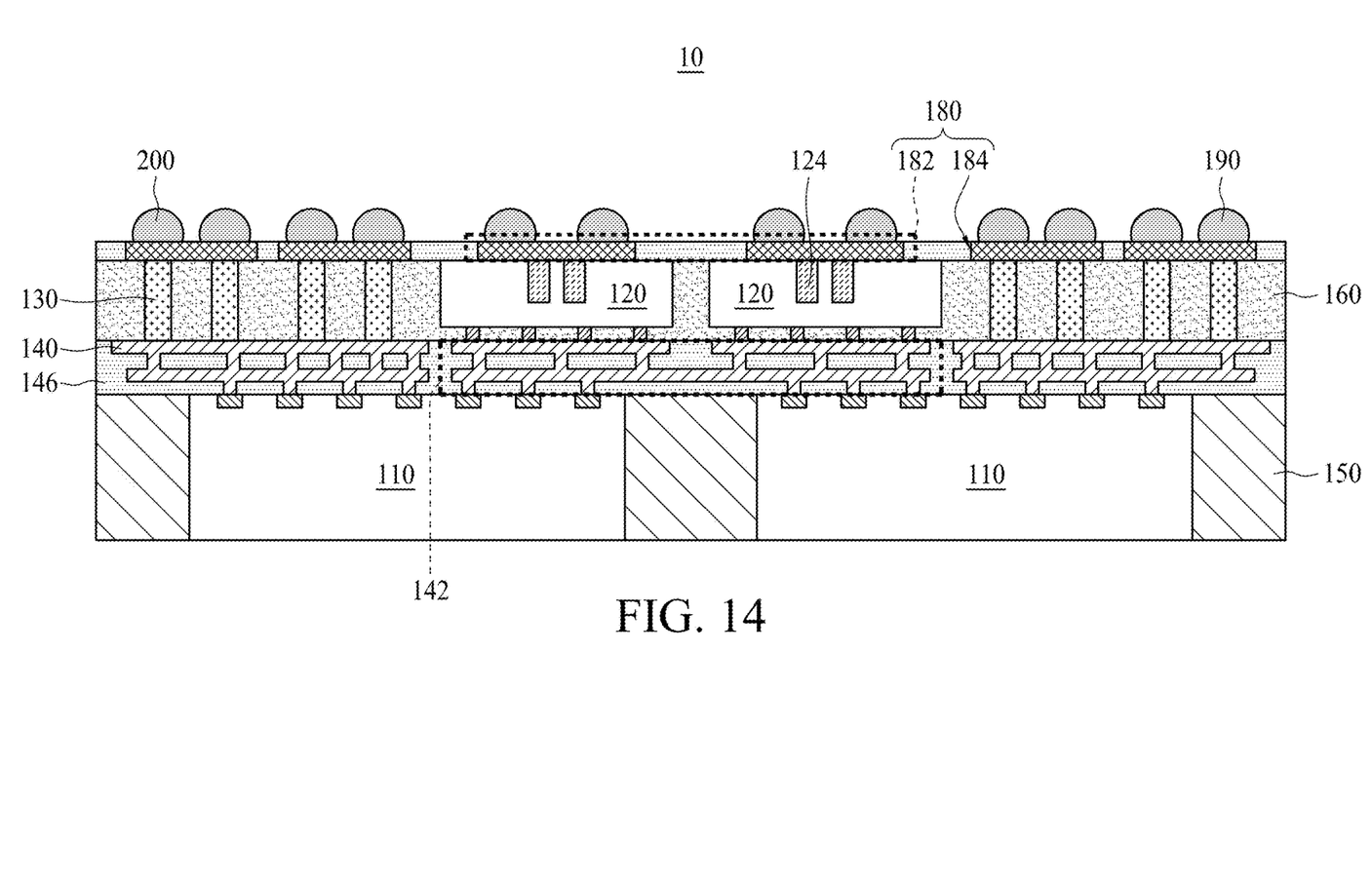

Referring to FIG. 14, a plurality of solder bumps 190 are disposed on the conductive layer 180 according to a step 318 in FIG. 2. In some embodiments, the solder bumps 190 are mounted by initially placing a solder flux (not shown) on the conductive layer 180, then disposing the solder bumps 190 on the solder flux, and once the solder bumps 190 are in contact with the solder flux, a reflow may be performed to reflow the material of the solder bumps 190 and the solder flux to physically bond the solder bumps 190 to the conductive layer 180. In some embodiments, the first portion 182 of the conductive layer 180 serves as an electrical interconnection to the second dies 120 and the solder bumps 190, and the second portion 184 of the conductive layer 180 serves as an electrical interconnection to the conductive plug 130 and the solder bump 190.

In conclusion, with the configuration of the semiconductor package 10, the first dies 110 are stacked on the second dies 120 and the conductive plugs 130, and the first dies 110 are arranged horizontally to reduce the footprint of the semiconductor package 10.

One aspect of the present disclosure provides a semiconductor package. The semiconductor package comprises at least one first die, at least one second die, a plurality of conductive plugs and a redistribution layer. The redistribution layer comprises a first segment and a second segment electrically isolated from the first segment. The first segment of the redistribution layer electrically connects the first die to the second die, and the second segment of the redistribution layer electrically connects the first die to the conductive plugs.

One aspect of the present disclosure provides a method of manufacturing a semiconductor package assembly. The method comprises steps of providing a plurality of first dies arranged horizontally; forming a redistribution layer on the first dies and the first insulative material, wherein the redistribution layer is divided into a first segment and a second segment electrically isolated from the first segment; mounting a plurality of second dies on the first segment of the redistribution layer; depositing a second insulative layer on the second dies and the redistribution layer; and forming a plurality of conductive plugs penetrating through the second insulative material and contacting the second segment of the redistribution layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor package assembly, comprising:
   providing a plurality of first dies arranged horizontally;
   forming a redistribution layer electrically coupled to the first dies, wherein the redistribution layer is divided into a first segment and a second segment electrically isolated from the first segment;
   mounting a plurality of second dies on the first segment of the redistribution layer;
   depositing a second insulative layer on the second dies and the redistribution layer;
   forming a plurality of conductive plugs penetrating through a second insulative material and contacting the second segment of the redistribution layer;
   depositing a passivation layer on the second dies, the conductive plugs and the second insulating layers;
   forming a conductive layer penetrating through the passivation layer, wherein the conductive layer comprises a first portion electrically coupled to the second dies and a second portion electrically isolated from the first portion and contacting the conductive plugs; and
   forming a plurality of solder bumps connected to the conductive layer.

2. The method of claim 1, further comprising forming at least one dielectric layer to encase the redistribution layer.

3. The method of claim 1, further comprising performing a grinding process to expose conductive lines of the second dies before the deposition of the passivation layer.

4. The method of claim 1, further comprising a first insulative material surrounding the first dies, wherein a melting point of the first insulative material is greater than that of the second insulative material.

5. The method of claim 1, wherein the first dies have a first distance therebetween, the second dies have a second distance therebetween, and the second distance is less than the first distance.

6. The method of claim 1, wherein the first segment is disposed at central portion of the redistribution layer, and the second segment surrounds the first segment.

7. The method of claim 1, wherein the first dies and the second dies are symmetric with respect to a central axis of the semiconductor package.

8. The method of claim 1, further comprising molding the first dies with a first insulative material before the formation of the redistribution layer.

* * * * *